TOOL FOR MOUNTING AND REMOVING PLUGGABLE CIRCUIT COMPONENTS

Filed March 4, 1968 3 Sheets-Sheet 1

INVENTOR
PETER MARTIN BRUNER
BY John R. Hopkins

INVENTOR
PETER MARTIN BRUNER
BY John C Hopkins

Nov. 10, 1970 P. M. BRUNER 3,538,580

TOOL FOR MOUNTING AND REMOVING PLUGGABLE CIRCUIT COMPONENTS

Filed March 4, 1968 3 Sheets-Sheet 3

INVENTOR
PETER MARTIN BRUNER

BY John R Hopkins

United States Patent Office 3,538,580

Patented Nov. 10, 1970

3,538,580
TOOL FOR MOUNTING AND REMOVING PLUGGABLE CIRCUIT COMPONENTS

Peter Martin Bruner, Mechanicsburg, Pa., assignor to AMP Incorporated, Harrisburg, Pa.

Filed Mar. 4, 1968, Ser. No. 710,309
Int. Cl. H01r *43/04;* B25b *7/00*
U.S. Cl. 29—203 5 Claims

ABSTRACT OF THE DISCLOSURE

A tool is disclosed for electrical and/or electronic components of the type having a plurality of relatively small component leads adapted to be inserted into a multiple connector block or header and/or withdrawn therefrom. The disclosed tool features a relatively rigid frame which fits around a component to center working arms carrying teeth closed to grip the component between the leads thereof without engaging or deforming such leads. The tool further features a series of rigid fingers which engage the component leads at the point of entry of such leads into the component and facilitate forcing the component into a mating header. The tool includes as a separate feature a frame structure with movable arms shaped to be closed against the frame structure to straighten component leads prior to installation in a component header.

BACKGROUND OF THE INVENTION

Integrated circuits have been developed which provide a number of electrical and/or electronic components within a very small package. Standard integrated circuits, called IC modules, are made which are a little less than an inch in length by about one-quarter of an inch in width and a little more than one-eighth of an inch in height. Typical modules have fourteen or sixteen leads extended therefrom with half the leads extended from one side and half from another side. The leads may be of configurations ranging from flat metal strips to round fine wires or some variation thereof. In many circuit applications large numbers of IC modules are pluggably mounted in arrays of connectors which are made to include relatively stiff contact springs receiving the IC leads. Frequently, module headers are very closely spaced. The small size of an IC module and the requirement of close spacing in conjunction with the easily deformable nature of the various leads thereof make handling of IC modules for mounting in headers or removal therefrom somewhat of a problem.

SUMMARY OF THE INVENTION

The present invention relates to a tool for mounting and removing electrical and/or electronic components of the type having numerous, easily deformable leads extended therefrom.

It is an object to provide a tool for mounting and removing small components without damaging the components or deforming the leads thereof. It is a further object to provide a tool which facilitates straightening of multiple component leads. It is yet another object to provide a tool assembly for use in handling and mounting electrical and/or electronic components of the type having numerous deformable leads extended therefrom.

The foregoing objects are attained by the invention through a tool which may be made in either one or two parts to include, at one end, fixed and movable elements which can be manually forced together to straighten the multiple leads of components and, at the other end, fixed and movable elements which may be manually brought together to grip a component without damaging it or deforming the leads thereof and enable such components to be forced into connecting engagement with the contact springs of a component header. The end of the tool used for holding a component includes movable elements which have teeth-like projections narrow enough to fit in between the leads of a component on each side of a component and grip the component body. Fingers fixed to a web within the tool extend down to engage component leads at the juncture of lead and component so that forces developed by driving a component into a mating engagement when the contact springs of a header are applied directly to the leads rather independently of either the teeth used to grip the component body or of the other lead engaging fingers of the tool.

Figures 3, 4, 5:
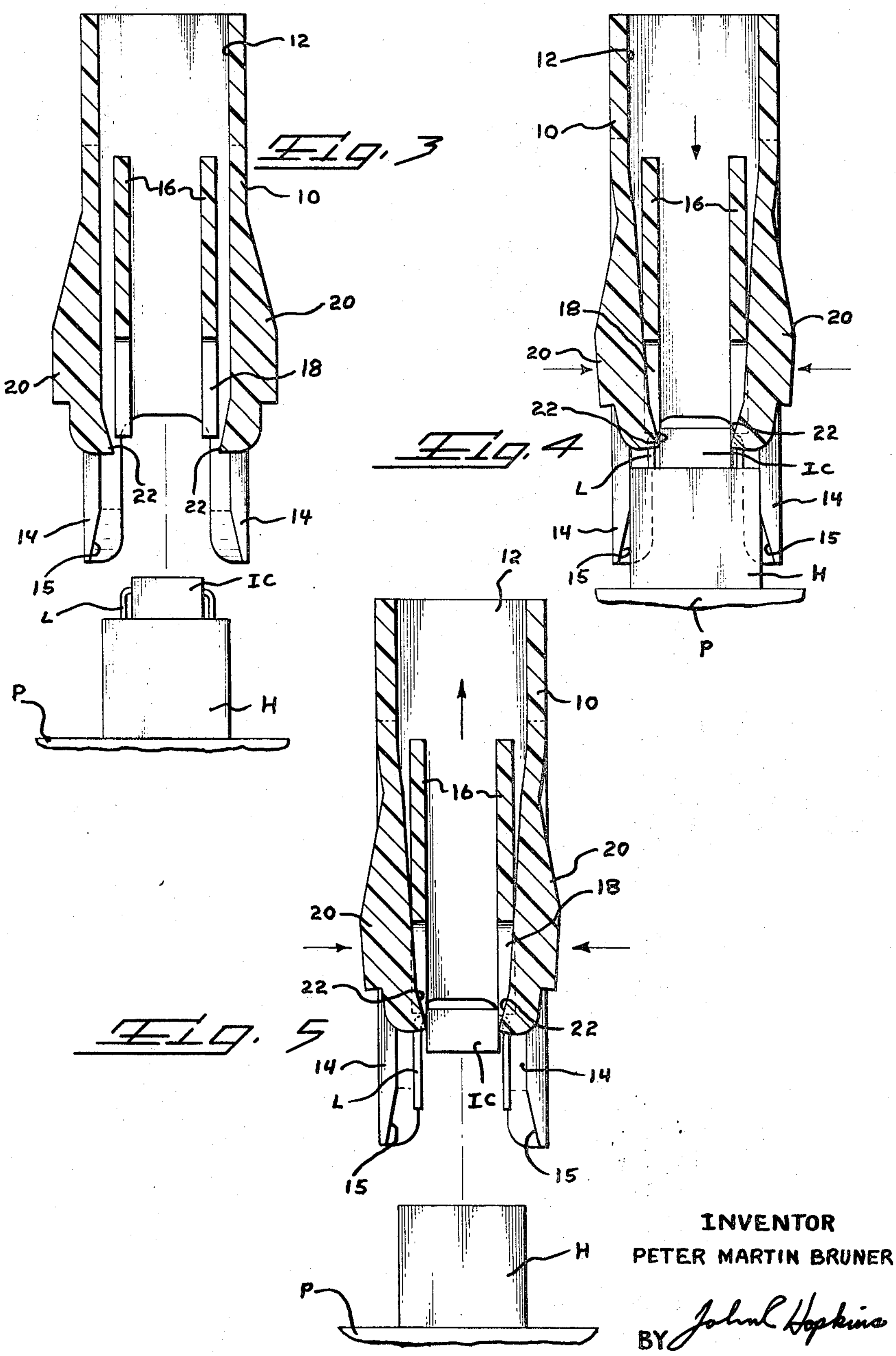
Figure 6:
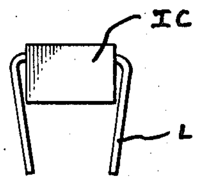
Figure 7:
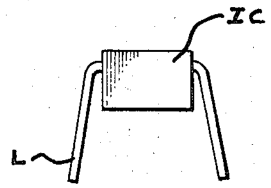
Figure 8:
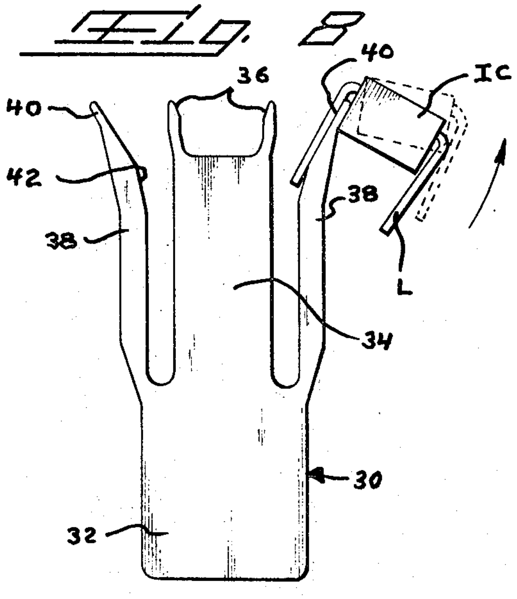
Figure 9:
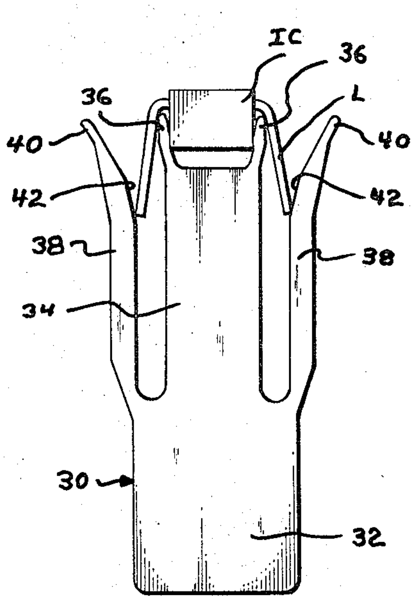
Figure 10:
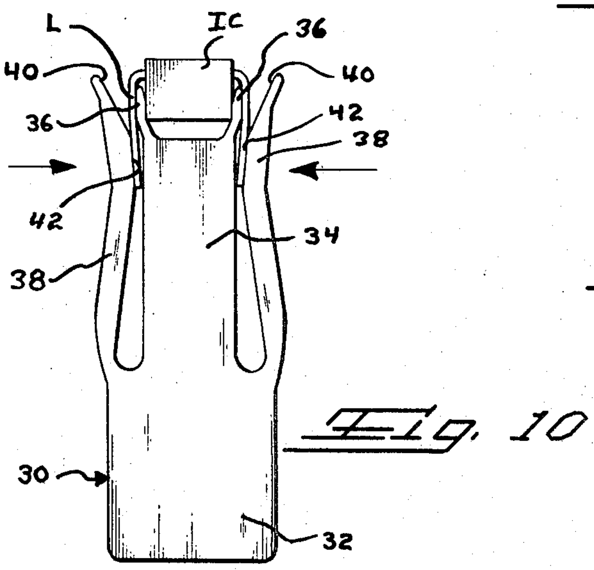
Figure 11:
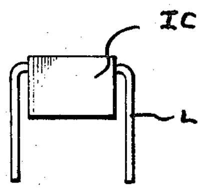

FIGS. 3, 4, and 5 are elevational views depicting a panel header and component with a tool partially sectioned to show the innards thereof, just prior to engagement with a component, during engagement on a header, and removed from a header in gripping relation holding a component, respectively;

FIGS. 6 and 7 are end views showing components having deformed leads;

FIGS. 8–10 are end-on views of a portion of a tool in the process of use straightening component leads; and FIG. 11 is an end-on view of a component having a lead properly positioned for use in a component header.

Figures 1, 2:
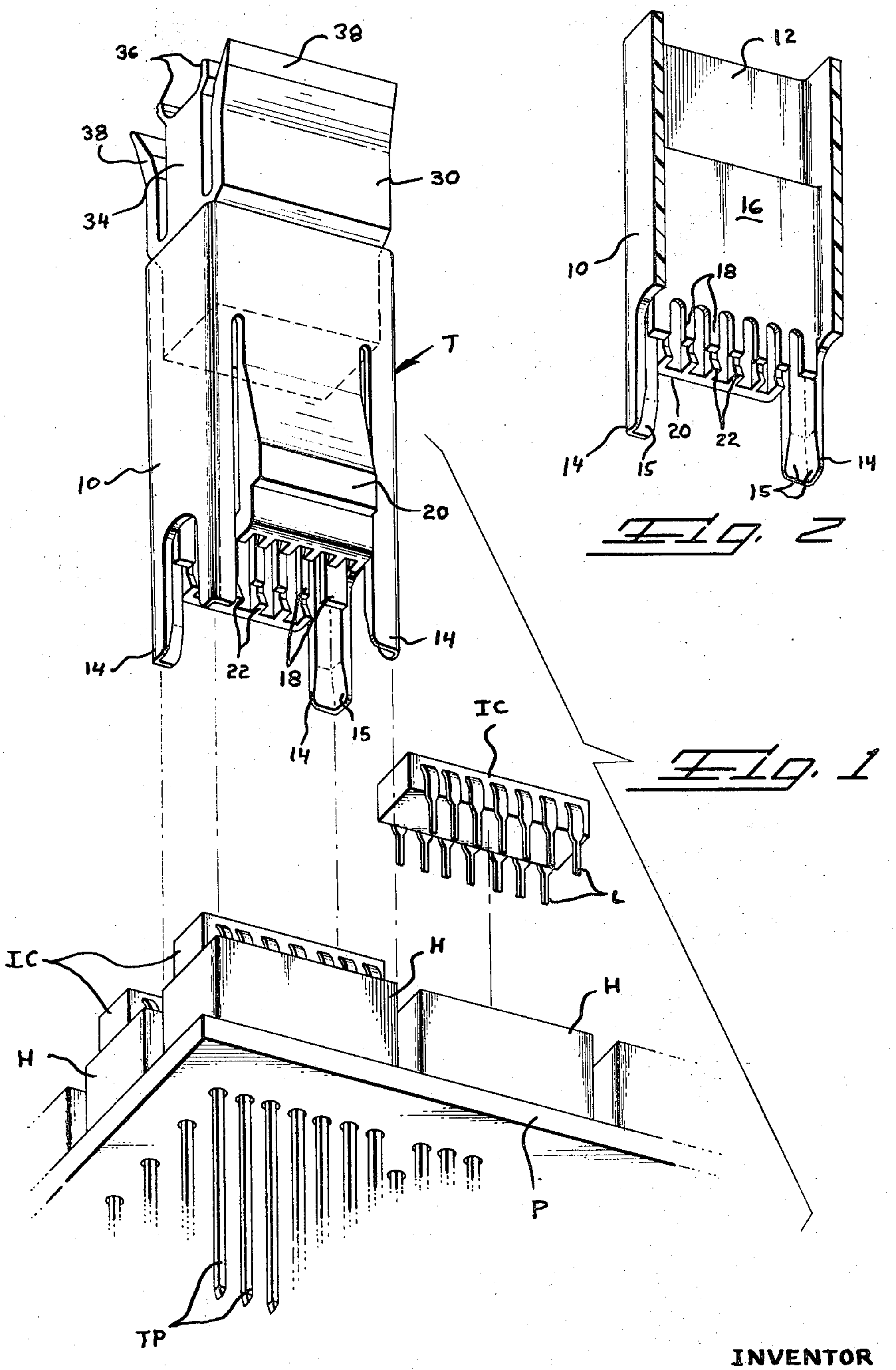
FIG. 1 is a perspective showing a tool in accordance with the invention disposed above a component carrying panel having a number of headers thereon containing components, one component being shown positioned above a header.
FIG. 2 is a section of the lower portion of the tool shown in FIG. 1.

Referring now to FIG. 1, the element P represents a panel of a type used to assemble electrical and/or electronic components. A number of terminal posts TP are shown extending through the panel and these posts are normally wired together to form a functional circuit.

Components for the circuit are provided through integrated circuit modules denominated IC which are connected through leads L, plugged into component headers, the headers being shown as H mounted on top of the panel. Reference is made to U.S. Pat. No. 3,467,944, filed of even date herewith under the title Interconnection System With Precision Terminal Alignment, by Kemper Hammell for a more complete teaching of an interconnection system utilizing the scheme depicted in FIG. 1. The headers H are essentially connectors which contain a number of contact spring elements oriented to receive the ends of the leads L of modules IC and interconnect such leads to the posts TP.

The view in FIG. 1 is enlarged from actual size approximately twice. The component IC is then a relatively small element and the leads L are quite small and easily deformable. If any one of the leads L is displaced from its proper position the component IC cannot be inserted into the header, since the end of the displaced lead will interfere with entry into the header. Header designs vary somewhat, but many designs incorporate springs which are relatively stiff and require a substantial force for insertion or withdrawal of the leads therewithin.

The body of the component IC is usually fairly rigid material and is made sufficiently strong to protect the integrated circuits contained therewithin. The rigidity of the body itself somewhat complicates the problem because it presents a hard sharp surface at the juncture point of the lead extending therewithin and it precludes any give to the body which could help align the leads for insertion within a header. On the other hand, the construction of the body IC is not so rigid that all considerations of component breakage may be ignored. In fact, some care must be exercised in handling the IC body to avoid stressing the interior thereof which could disturb the integrated circuits therein, even though the body itself shows no crack or fracture.

Those experienced in the particular art to which the present invention is directed will readily appreciate the difficulty sometimes experienced in mounting IC modules in headers and in removing such modules from headers. The tool T shown in FIG. 1 is comprised of a lower portion 10 which facilitates handling IC modules and an upper portion 30 which facilitates straightening of the leads of IC modules. The embodiment shown in FIG. 1 is comprised of separate pieces 10 and 30 with 10 including an end dimensioned to receive and accommodate 30. It is contemplated that T may be made of one piece combining 10 and 30 into the same structure. In the description hereinafter to follow 10 and 30 will be shown to be made of a plastic material. It is fully contemplated that these elements may be made of metal with insulation provided where necessary, if the tool is to be used to handle components while power is supplied.

Turning first to a description of the element 10 of T, FIG. 2 shows the element sectioned to include an upper recessed portion 12 dimensioned to receive a mating portion of element 30. Four legs 14 are made to extend from the other end and are disposed to fit around the four corners of H. The ends of 14 are beveled as at 15 to facilitate positioning on H. Element 10 includes two webs 16 extending therethrough in the manner shown in FIGS. 3–5. Each of the webs, as shown in FIG. 2 is joined to the walls of the elements and made to include in the lower portion thereof a series of fingers 18. The fingers 18 are centered along centers corresponding to leads L of an IC module. As shown in FIG. 2 and as further shown in FIGS. 3–5, element 10 includes on each side a movable gripping element 20 which joins the frame of 10 at the top and ends in a series of teeth 22 carried interiorly on a common lower wall of the element. The teeth 22 are of a width to fit in between leads L of an IC module and are along center lines to fit between such leads and between the fingers 18 in the manner shown in FIG. 4. As shown in FIGS. 3–5, the webs 16 serve to limit the inward disposition of the gripping elements 20.

Turning now to the operation of the element 10 of tool T, FIG. 3 shows the tool in an open position above a panel containing a header H and a module IC with the leads L thereof plugged into H. The tool is brought down into the position shown in FIG. 4 with the legs 14 tending to guide and center the tool on module IC by engagement with the rounded outside corners of the header H. The ends of fingers 18 are individually engaged with the top juncture point of each lead L with IC and limit downward movement of 10. At this time the tool is properly centered on IC and the teeth 22 are disposed inwardly, as indicated by the arrows in FIG. 4 so as to grip the sides of IC without bearing upon leads L. By holding elements 20 inwardly the tool 10 may be withdrawn upwardly as indicated by the arrow in FIG. 5 to remove module IC from the header.

To install an IC module onto a header the module may be placed within the tool with the terminals against the fingers 18 and with gripping elements 20 then closed toward the body of IC until teeth 22 grip the body thereof. The tool carrying an ICC module may then be pushed downwardly over a header with the tapered portion or surfaces 15 of the legs 14 guiding the tool into a proper position before actual engagement of leads L with any portion of H. The tool may then be pushed down further to fully insert L within H. The axial force of insertion is carried directly by teeth 18. This feature permits use of the tool with headers of different body heights. Note that in FIGS. 3, 4, and 5 there is a space above and between the fingers 18 as joined to webs 16. This feature, which is based upon the engagement of module leads extends considerably the utility of the tool element 10. While the tool element 10 has been depicted for use with an ICC module having 14 leads, it is of course contemplated for use with modules of fewer leads. It is further contemplated that a tool having the features of that previously described could be made considerably larger to handle components and modules having a greater number of leads. The legs 14 of tool element 10 have been shown to extend to engage the four corners of a header. It is contemplated that two diagonally positioned legs may be alternatively used to provide this keying function or in certain instances, depending on component configuration or spacing, the legs may be removed from the tool with certain aspects of the invention functioning in the same manner as described.

Turning now to a further aspect of the invention, FIGS. 6 and 7 show ICC modules having leads L deformed inwardly or outward relative to the proper position thereof. FIG. 8 shows the tool element 30 to be comprised of a lower body 32 having a central upwardly projecting portion 34 ending in projections 36. These projections are spaced apart to receive the body of an ICC module inserted therein as shown in FIG. 9. The ends of projections 36 are made of a thickness to fit between the body of an IC module and the leads thereof in the manner shown in FIG. 9. A pair of movable arms 38 are each attached to 30 to extend upwardly parallel to 34. The arms are flared generally outwardly at the ends and include an end 40 of a proper thickness to fit between leads L and the body of the IC module in the manner shown in FIG. 8. The arms 38 include interior flat surfaces shown as 42 which drive the leads inwardly in the manner shown in FIG. 10. In use an IC module deformed as shown in FIG. 6 is treated as shown in FIG. 8 by forcing an end 40 of an arm 38 between the leads L and the body of the IC module. IC modules having leads deformed as shown in FIG. 7 are fitted into the tool element 30 in the manner shown in FIG. 9, and the leads are straightened in the manner shown in FIG. 10 by closure of arms 38 to bend the leads to the configuration shown in FIG. 11. As can be discerned from FIG. 8–10, the arms 38 of the tool are sufficiently long to accommodate leads of a length substantially greater than that shown. As can also be discerned projection 34 has a recess between projections 36, which is sufficiently deep to accommodate IC modules of the somewhat different configuration.

It should be understood that the invention contemplates individual utility of the tool portion 10 and the tool portion 30. The feature of the tool which facilitates gripping an IC module and insertion are contemplated as having a utility apart from a use with headers like that shown. It is fully contemplated that the tool portion 10 may be made without legs.

Having now disclosed the invention in terms intended to enable a preferred practice thereof in various modes, claims are appended which are intended to define what is inventive.

What is claimed is:

1. A tool for handling components of the type having a plurality of leads extending from a component housing comprising a body member having a cavity at one end arranged to receive the volume of a component housing; first means including a plurality of fingers attached to said body member and extending into said cavity to bear against the leads of a component; and second means attached to said body member and movable relative thereto to extend partially within said cavity for gripping said component housing without forcibly engaging the leads thereof to mount a component in or remove a component from a header having receptacles into which the leads of the component are inserted or withdrawn, with said first means applying the required insertion force to said leads directly rather than through said component housing and with said second means applying the force necessary for removal; said second means including a plurality of teeth positioned to extend between said fingers to grip said component housing with said fingers in engagement with the leads of the component; and said body member having at least a pair of legs extending therefrom and positioned to engage portions of a header and center said tool and a component carried thereby on said header prior to engagement of the component leads with receptacles in the header.

2. A tool for handling components of the type having a plurality of leads extending from a component housing comprising a frame having a first cavity at one end and a second cavity at the other end thereof, each of said cavities being dimensioned to receive the housing of a component; said frame including at said one end means for bending the component leads into a parallel disposition in rows spaced apart by a given distance, said bending means comprising a central rigid projection of said frame which ends in said first cavity and small rigid projections on each side of said first cavity shaped to fit between the component housing and the leads thereof, and a pair of movable arms attached to said frame and extending parallel to said central projection, said arms having interior surfaces for engaging the leads of a component housing mounted in said first cavity and for driving said leads inwardly against said central projection about said rigid projections to straighten said leads into said parallel disposition, the ends of said arms being of a shape to be fitted between the leads on one side of a component and the component housing to drive said leads outwardly from the housing into said parallel disposition; means at said other end of said frame for gripping the component housing; and means spaced apart by slightly less than said given distance for bearing against said leads and facilitating insertion of said leads into the receptacles of a header.

3. A tool for handling components of the type having a plurality of leads extending from a component housing comprising a body member having a cavity at one end thereof arranged to receive the volume of a component housing; first means including a plurality of fingers attached to said body member and extending into said cavity to bear against the leads of a component; and second means attached to said body member and movable relative thereto to extend partially within said cavity for gripping said component housing without forcibly engaging the leads thereof to mount a component in or remove a component from a header having receptacles into which the leads of the component are inserted or withdrawn, with said first means applying the required insertion force to said leads directly rather than through said component housing and with said second means applying the force necessary for removal; said second means including a plurality of teeth positioned to extend between said fingers to grip said component housing with said fingers in engagement with the leads of the component.

4. A tool for handling components of the type having a plurality of leads extending from a component housing comprising a body member having a cavity at one end arranged to receive the volume of a component housing, means attached to said body member extending into said cavity to bear against the leads of a component, and gripping means attached to said body member and movable relative thereto to extend partially within said cavity for gripping said component housing without forcibly engaging the leads thereof to mount a component in or remove a component from a header having a receptacle into which the leads of the component are inserted or withdrawn, with said means bearing against the component leads applying the required insertion force to said leads directly rather than through said component housing and said gripping means applying the force necessary for removal.

5. A tool for handling components of the type having a plurality of leads extending from a component housing and for straightening bend leads thereof, said tool comprising a frame having a first cavity at one end and a second cavity at the other end thereof, each of said cavities being dimensioned to receive the housing of a component, said frame including at said one end means for bending the component leads into a parallel disposition in rows spaced apart by a given distance, means at said other end of said frame for gripping the component housing to apply the force necessary for removal of said leads from the receptacles of a header, and means spaced apart by slightly less than said given distance for bearing against said leads and facilitating insertion of said leads into said receptacles of a header.

References Cited

UNITED STATES PATENTS

| | | | |
|---|---|---|---|
| 3,267,565 | 8/1966 | Stuhler | 29—206 |
| 3,267,716 | 8/1966 | Hales | 72—384 |
| 3,401,548 | 9/1968 | Ross et al. | |
| 3,443,297 | 5/1969 | Lusby. | |

THOMAS H. EAGER, Primary Examiner

U.S. Cl. X.R.

29—206